(12) United States Patent
Bertness et al.

(10) Patent No.: US 6,906,522 B2
(45) Date of Patent: Jun. 14, 2005

(54) BATTERY TESTER WITH BATTERY REPLACEMENT OUTPUT

(75) Inventors: Kevin I. Bertness, Batavia, IL (US); William G. Sampson, Lombard, IL (US)

(73) Assignee: Midtronics, Inc., Willowbrook, IL (US)

( * ) Notice: Subject to any disclaimer, the term of this patent is extended or adjusted under 35 U.S.C. 154(b) by 427 days.

(21) Appl. No.: 10/112,998

(22) Filed: Mar. 29, 2002

(65) Prior Publication Data

US 2003/0184306 A1 Oct. 2, 2003

(51) Int. Cl.$^7$ ............................................. G01N 27/416
(52) U.S. Cl. ................................................... 324/426
(58) Field of Search ................................ 324/426, 427, 324/428, 429, 430, 431, 432, 433

(56) References Cited

U.S. PATENT DOCUMENTS

| | | | |
|---|---|---|---|
| 2,514,745 A | 7/1950 | Dalzell ........................ 171/95 |
| 3,356,936 A | 12/1967 | Smith ........................ 324/29.5 |
| 3,562,634 A | 2/1971 | Latner ............................ 31/4 |
| 3,593,099 A | 7/1971 | Scholl ........................ 320/13 |
| 3,607,673 A | 9/1971 | Seyl .............................. 204/1 |
| 3,676,770 A | 7/1972 | Sharaf et al. .............. 324/29.5 |
| 3,729,989 A | 5/1973 | Little ........................... 73/133 |
| 3,753,094 A | 8/1973 | Furuishi et al. ............ 324/29.5 |
| 3,808,522 A | 4/1974 | Sharaf ....................... 324/29.5 |
| 3,811,089 A | 5/1974 | Strezelewicz .............. 324/170 |
| 3,873,911 A | 3/1975 | Champlin .................. 324/29.5 |
| 3,876,931 A | 4/1975 | Godshalk ................... 324/29.5 |
| 3,886,443 A | 5/1975 | Miyakawa et al. ........ 324/29.5 |
| 3,889,248 A | 6/1975 | Ritter ........................ 340/249 |
| 3,906,329 A | 9/1975 | Bader ........................... 320/44 |
| 3,909,708 A | 9/1975 | Champlin .................. 324/29.5 |
| 3,936,744 A | 2/1976 | Perlmutter ................. 324/158 |
| 3,946,299 A | 3/1976 | Christianson et al. ......... 320/43 |
| 3,947,757 A | 3/1976 | Grube et al. ................. 324/28 |
| 3,969,667 A | 7/1976 | McWilliams .............. 324/29.5 |
| 3,979,664 A | 9/1976 | Harris ........................ 324/17 |
| 3,984,762 A | 10/1976 | Dowgiallo, Jr. ............ 324/29.5 |
| 3,984,768 A | 10/1976 | Staples ........................ 324/62 |
| 3,989,544 A | 11/1976 | Santo ........................ 429/65 |
| 4,008,619 A | 2/1977 | Alcaide et al. .............. 73/398 |
| 4,024,953 A | 5/1977 | Nailor, III .................. 206/344 |
| 4,047,091 A | 9/1977 | Hutchines et al. ........... 363/91 |
| 4,053,824 A | 10/1977 | Dupuis et al. .............. 324/29.5 |
| 4,070,624 A | 1/1978 | Taylor ........................ 327/158 |
| 4,086,531 A | 4/1978 | Bernier ...................... 324/158 |
| 4,112,351 A | 9/1978 | Back et al. .................. 324/16 |
| 4,114,083 A | 9/1978 | Benham et al. ............. 320/39 |
| 4,126,874 A | 11/1978 | Suzuki et al. .............. 354/60 |
| 4,178,546 A | 12/1979 | Hulls et al. ................ 324/158 |
| 4,193,025 A | 3/1980 | Frailing et al. ............. 324/427 |
| 4,207,611 A | 6/1980 | Gordon ...................... 364/580 |
| 4,217,645 A | 8/1980 | Barry et al. ................ 364/483 |
| 4,297,639 A | 10/1981 | Branham .................... 324/429 |
| 4,315,204 A | 2/1982 | Sievers et al. .............. 322/28 |
| 4,316,185 A | 2/1982 | Watrous et al. ............ 340/636 |
| 4,322,685 A | 3/1982 | Frailing et al. ............. 324/429 |
| 4,351,405 A | 9/1982 | Fields et al. ................ 180/65 |
| 4,361,809 A | 11/1982 | Bil et al. .................... 324/426 |
| 4,363,407 A | 12/1982 | Buckler et al. ............. 209/3.3 |
| 4,369,407 A | 1/1983 | Korbell ...................... 324/416 |
| 4,379,989 A | 4/1983 | Kurz et al. .................. 320/26 |
| 4,379,990 A | 4/1983 | Sievers et al. .............. 322/99 |

(Continued)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| RU | 2089015 C1 | 8/1997 |
| WO | WO 93/22666 | 11/1993 |
| WO | WO 94/05069 | 3/1994 |
| WO | WO 98/58270 | 12/1998 |
| WO | WO 99/23738 | 5/1999 |
| WO | WO 00/67359 | 11/2000 |
| WO | WO 01/51947 | 7/2001 |

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

(Continued)

*Primary Examiner*—Edward H. Tso
(74) *Attorney, Agent, or Firm*—Westman, Champlin & Kelly

(57) ABSTRACT

An electronic battery tester for testing a storage battery. The battery tester provides a replacement battery output as a function of battery environment information and battery replacement information.

59 Claims, 4 Drawing Sheets

U.S. PATENT DOCUMENTS

| | | | |
|---|---|---|---|
| 4,385,269 A | 5/1983 | Aspinwall et al. | 320/14 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,564,798 A | 1/1986 | Young | 320/6 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,686,442 A | 8/1987 | Radomski | 320/17 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,888,716 A | 12/1989 | Ueno | 364/550 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/432 |
| 4,947,124 A | 8/1990 | Hauser | 324/430 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/434 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,434 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/48 |
| 5,572,136 A | 11/1996 | Champlin | 324/426 |
| 5,574,355 A | 11/1996 | McShane et al. | 320/39 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,653,659 A | 8/1997 | Kunibe et al. | 477/111 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,711,648 A | 1/1998 | Hammerslag | 414/786 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |

| | | | |
|---|---|---|---|
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/43.4 |
| 5,818,234 A | 10/1998 | McKinnon | 324/433 |
| 5,821,756 A | 10/1998 | McShane et al. | 324/430 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/21 |
| 5,895,440 A | 4/1999 | Proctor et al. | 702/63 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,061,638 A | 5/2000 | Joyce | 702/63 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/132 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,161,640 A | 12/2000 | Yamaguchi | 180/65.8 |
| 6,163,156 A | 12/2000 | Bertness | 324/426 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,222,369 B1 | 4/2001 | Champlin | 324/430 |
| 6,225,808 B1 | 5/2001 | Varghese et al. | 324/426 |
| 6,236,332 B1 | 5/2001 | Conkright et al. | 340/825.06 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertess | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| 6,384,608 B1 | 5/2002 | Namaky | 324/425 |
| 6,388,448 B1 | 5/2002 | Cervas | 324/426 |
| 6,392,414 B2 | 5/2002 | Bertness | 324/429 |
| 6,411,098 B1 | 6/2002 | Laletin | 324/436 |
| 6,417,669 B1 | 7/2002 | Champlin | 324/426 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,495,990 B2 | 12/2002 | Champlin | 320/132 |

OTHER PUBLICATIONS

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", Mar. 1969, Linear Brief 5, Mar. 1969.

Burr–Brown Corporation, "Design A 60 Hz Notch Filter with the UAFA2", 1/94, AB–071, 1994.

National Semiconductor Corporation, "LMF90–$4^{th}$–Order Elliptic Notch Filter", Dec. 1994, RRD–B30M115.

"Alligator Clips with Wire Penetrators" *J.S. Popper, Inc.* product information, downloaded from http://www.jspopper.com/, undated.

"#12: LM78S40 Simple Switcher DC to DC Converter", *ITM e–Catalog*, downloaded from http://www.pcbcafe.com, undated.

"Simple DC–DC Converts Allows Use of Single Battery", *Electronix Express*, downloaded from http://www.elexp.com/t_dc–dc.htm, undated.

"DC–DC Converter Basics", *Power Designers*, downloaded from http://www.powederdesigners.com/InforWeb.design_center/articles/DC–DC/converter.shtm, undated.

"Notification of Transmittal of The International Search Report or the Declaration", PCT/US02/29461.

BATTERY TESTER WITH BATTERY REPLACEMENT OUTPUT

BACKGROUND OF THE INVENTION

The present invention relates to storage batteries. More specifically, the present invention relates to a battery system tester for testing storage batteries.

Many attempts have been made to test storage batteries. One technique which has been pioneered by Dr. Keith S. Champlin and Midtronics, Inc. of Burr Ridge, Ill. relates to measuring the conductance of batteries to determine their condition. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; and U.S. Pat. No. 6,316,914, issued Nov. 13, 2001, entitled TESTING PARALLEL STRINGS OF STORAGE BATTERIES.

Substantially accurate information regarding the condition of a storage battery can be generally obtained by employing current battery testing techniques. However, in certain testing situations, a battery tester providing information limited to the condition of the battery may be inadequate. For example, if an automobile battery tested at a service department fails the battery test, in addition to the test result, battery replacement information needs to be provided to the customer. Since current testers typically do not provide such information, service personnel usually have to suggest suitable battery replacement options to the customer. Reliance on the recommendations of the service personnel regarding battery replacement may not be advantageous for the testing facility as well as the customer. In general, inadequate and inaccurate battery replacement information can lead to the selection of a battery that is unsuitable for the conditions under which the vehicle is operated, which may result in additional cost and potential damage to the battery and vehicle.

SUMMARY OF THE INVENTION

The present invention includes a method and apparatus for testing a storage battery. A battery test result, battery environment information and battery replacement information is used to provide an output related to a replacement battery or battery replacement options.

DETAILED DESCRIPTION OF THE PREFERRED EMBODIMENTS

The present invention provides an apparatus and method for conducting a battery test and utilizing a test result, battery replacement information and battery environment information to provide an output related to a replacement battery or battery replacement options.

Figure 1:
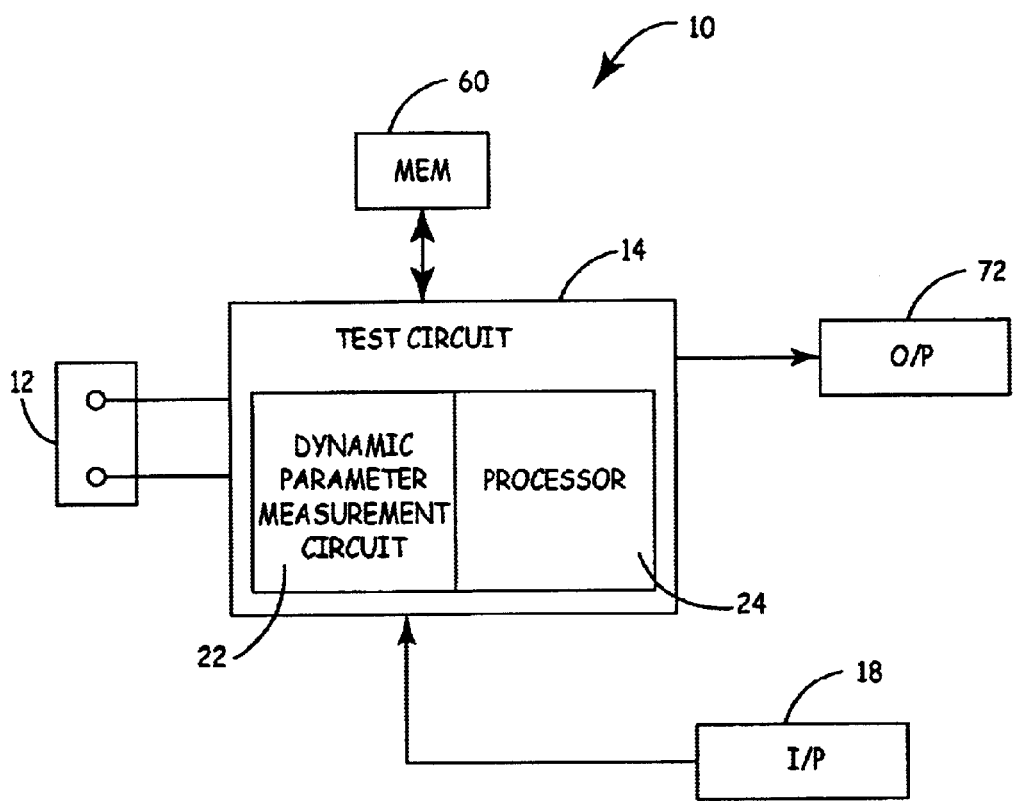
FIG. 1 is a very simplified block diagram showing a battery tester in accordance with an embodiment of the present invention.

FIG. 1 is a very simplified block diagram of a battery tester 10 in accordance with an illustrative embodiment of the present invention. Note that FIG. 1 is a simplified diagram of a specific type of battery tester. However, the present invention is applicable to any type of battery tester including those which do not use dynamic parameters. Other types of example testers include testers that conduct load tests, current based tests, voltage based tests, tests which apply various conditions or observe various performance parameters of a battery, etc. Battery tester 10 includes a test circuit 14 that directly couples to vehicle battery 12. Test circuit 14 includes dynamic parameter measurement circuit 22 and processor 24. Dynamic parameter measurement circuit 22 can be any circuit configuration which measures a dynamic parameter of battery 12. As used herein, a dynamic parameter is one which is related to a signal having an AC component. The signal can be either applied directly or drawn from battery 12. Example dynamic parameters include dynamic resistance, conductance, impedance, admittance, etc. This list is not exhaustive, for example, a dynamic parameter can include a component value of an equivalent circuit of battery 12. A test result is obtained by processor 24 as a function of the dynamic parameter measured by dynamic parameter measurement circuitry 22. Input 18 can be any type of input and is not limited to a user input. The input received from input 18 can be any type of input data and does not need to be user generated. Example input data includes every make, model, type, construction date, present date, temperature, vehicle type, Vehicle Identification Number (VIN) code for the vehicle, battery service requirements, requirements for a particular application, etc. Battery tester 10 can provide an output related to a replacement battery or battery replacement options for vehicle battery 12 if the test result obtained indicates that it is in a substantially "worn out" condition.

As used herein, battery test condition information can be any information generated or the result of a battery test. This can include intermediary measurements or reactions of the battery to the battery test as well as the actual test result. Battery test information can be both qualitative and quantitative. Further, as used herein, battery environment information can be any type of test condition information received through input 18 as well as environmental measurements, such as temperature or information stored in memory 60 related to geographic location of the battery test, geographic location in which the battery under test is used, seasons during which the battery under test is used, dealer identification, service station identification, operator identification, information related to the warranty of the battery under test, etc. Further, as used herein, battery replacement information is any type of information or data which correlates a replacement battery with some type of battery environment information as defined above. The replacement information can be, for example, stored in memory 60 in the form of a table or other data structure. The replacement information can be periodically downloaded into memory or be substantially permanently stored in memory 60.

There are a number of factors that determine the selection an appropriate replacement battery. First, the replacement battery should be of an appropriate size (battery group size) such that it can properly fit the physical dimensions of the vehicle. Further, the cold cranking amp (CCA) rating and the battery reserve capacity (RC) are important considerations in choosing a replacement battery. CCA is critical for good cranking ability and RC indicates the battery's "staying power" (how many minutes the battery can supply ample power without falling below the minimum voltage needed to run the vehicle when the alternator has failed). In general, for both CCA and RC, the higher the number the better. However, when the vehicle is primarily operated in a cold climate, the CCA rating is a very important consideration and needs to be higher. Conversely, if the vehicle is used in a high heat climate, as much CCA is not required.

In accordance with the present invention, battery tester 10 provides a battery replacement output 72 which is indicative of a possible replacement battery as a function of the battery test result, battery environment information and battery replacement information. The replacement battery output 72 can be in the form of a battery model, serial number, rating or some other way to identify a replacement battery which is either available in inventory or can be obtained from another source. In some embodiments, the battery replacement information is specifically limited to those batteries which are currently in inventory at the site of the battery test. In such a configuration, battery replacement information stored in the memory 60 is modified in substantially real time as the local inventory is replenished or depleted. The battery replacement information can also be related to the warranty provided by the battery. For example, if the battery is still under warranty, the battery replacement output can be modified to be more or less likely to suggest a replacement battery or suggest a particular type of replacement battery.

In one simple embodiment, the battery replacement information can be in the form of a table in which a particular battery replacement type is identified with a number of particular qualities of that type. For example, the table can contain a battery type followed by information related to battery rating, preferred or recommended environmental climate conditions, particular vehicles for which that battery is well-suited, particular vehicles or driving patterns for which that battery is well-suited, etc.

Battery replacement information can also be modified or can include information regarding the condition of replacement batteries such as the age of the replacement battery, current sales or other promotional activities, a particular quality level of a battery, such as a "premium" battery, etc. Incentives to replace batteries which have not completely failed a test can also be provided in the battery replacement information. This can assist or encourage customers to replace batteries prior to their ultimate failure.

With the present invention, processor 24 performs some type of correlation between the battery environment information and battery replacement information in order to generate output 72. The correlation can be a simple comparison between the environment information and the various entries in a table of data of the battery replacement information. Some entries in the table can be given higher preference than others, for example, the climate recommendations for a particular battery can override other types of replacement battery information such as a particular brand of battery, etc. Similarly, physical size restrains can also be an overriding entry in the battery replacement information so that the suggested replacement battery is assured to physically fit in a particular vehicle. Another example entry which may be given a higher weight includes the battery output capabilities so that the suggested battery is capable of sufficiently powering a vehicle or other application not identified by the battery environment information. Correlation can be performed using a simple rule set using if/then comparisons, weighted averages, fuzzy logic or other decision-making techniques.

Figure 2:
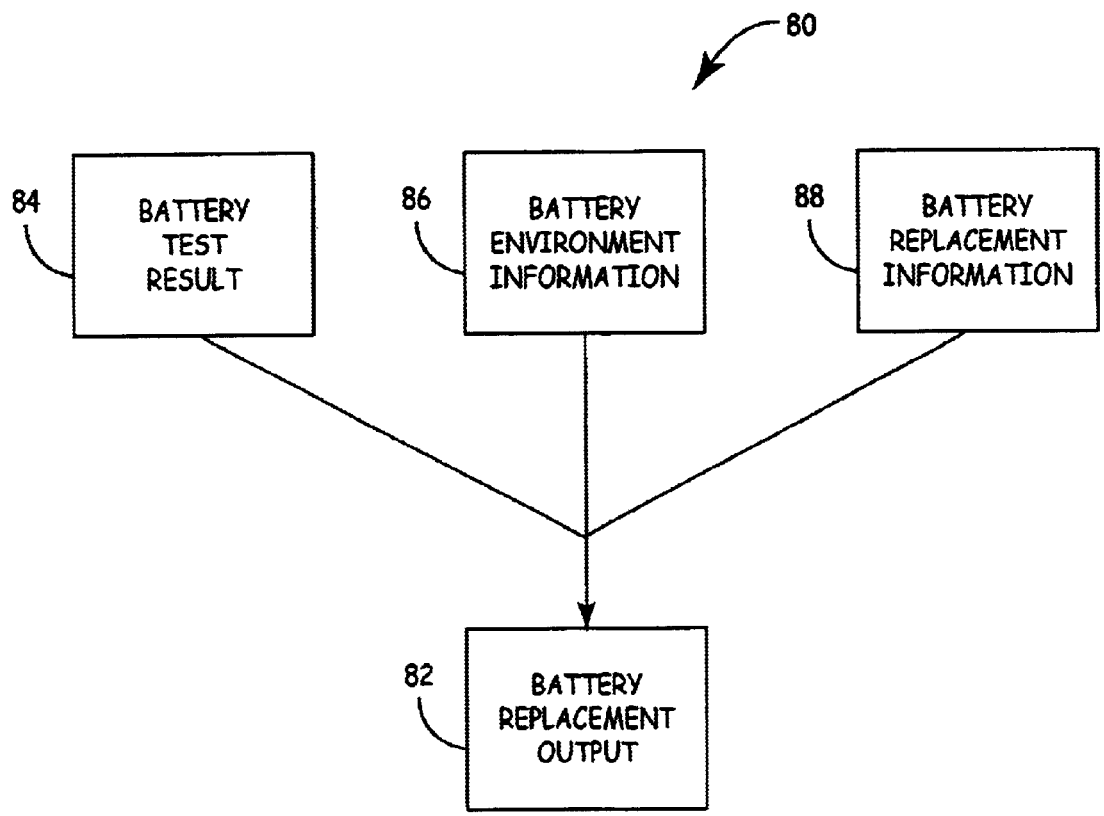
FIG. 2 is a simplified block diagram showing different data components used to obtain battery replacement options.

FIG. 2 is a block diagram illustrating the generation of a battery replacement output. As illustrated in FIG. 2, battery replacement output 82 is generated as a function of battery test result 84, battery environment information 86 and battery replacement information 88.

Figure 3:
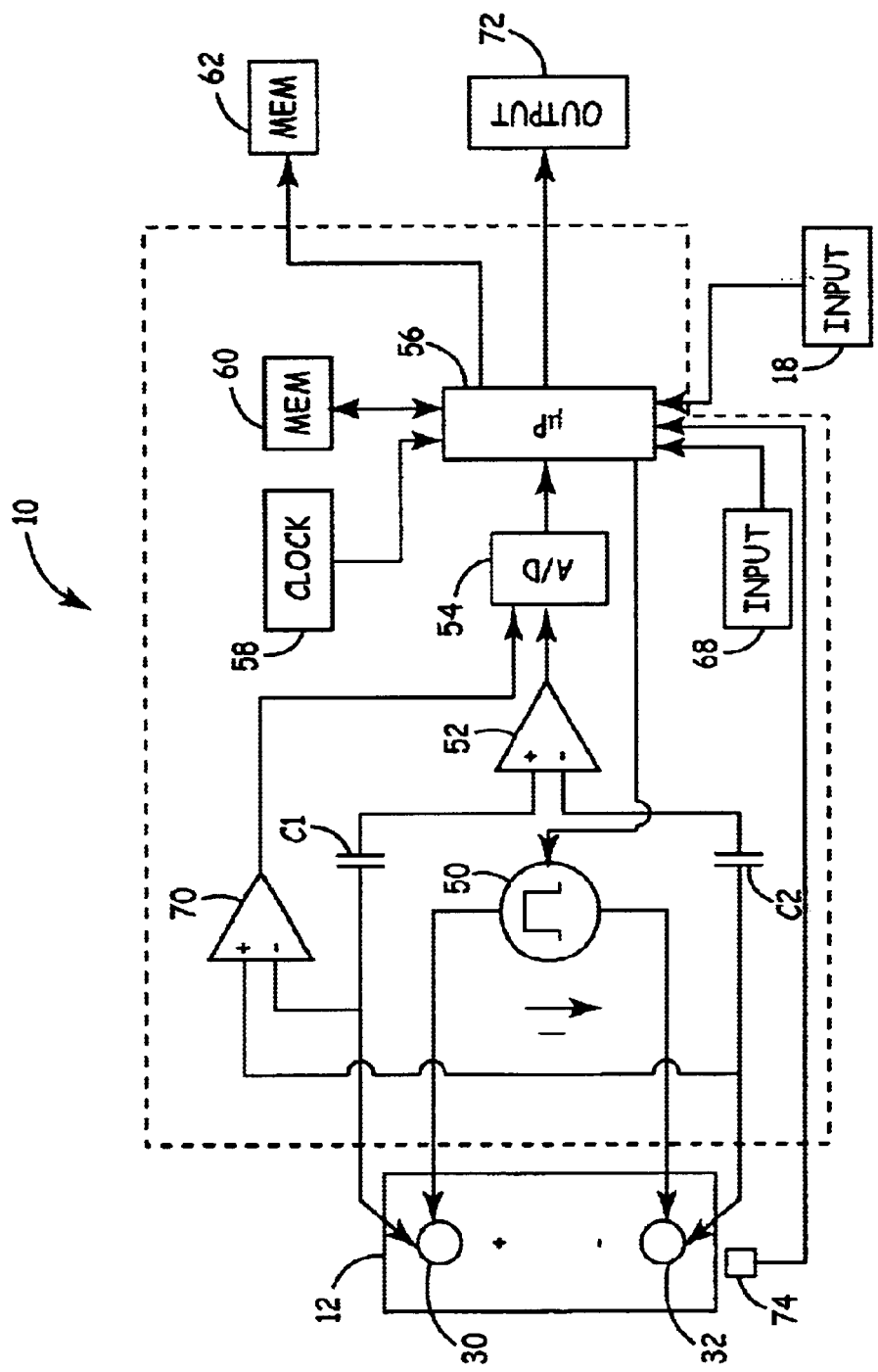
FIG. 3 is a simplified block diagram showing a battery tester in accordance with an embodiment of the present invention.

FIG. 3 is a simplified block diagram of electronic battery tester circuitry 10 in accordance with a specific embodiment of the present invention. Apparatus 10 is shown coupled to battery 12 which includes a positive battery terminal 30 and a negative battery terminal 32. Circuitry 10 includes current source 50, differential amplifier 52, analog-to-digital converter 54 and microprocessor 56. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60, memory 62 and analog-to-digital converter 54. Microprocessor 56 is also capable of receiving an input from input devices 18 and 68. Microprocessor 56 also connects to output device 72.

In operation, current source 50 is controlled by microprocessor 56 and provides current I in the direction shown by the arrow in FIG. 3. In one embodiment, this is a square wave or a pulse. Differential amplifier 52 is connected to terminals 30 and 32 of battery 12 through capacitors $C_1$ and $C_2$, respectively, and provides an output related to the voltage potential difference between terminals 30 and 32. In a preferred embodiment, amplifier 52 has a high input impedance. Circuitry 10 includes differential amplifier 70 having inverting and noninverting inputs connected to terminals 30 and 32, respectively. Amplifier 70 is connected to measure the open circuit potential voltage ($V_{BAT}$) of battery 12 between terminals 30 and 32. The output of amplifier 70 is provided to analog-to-digital converter 54 such that the voltage across terminals 30 and 32 can be measured by microprocessor 56.

Circuitry 10 is connected to battery 12 through a four-point connection technique known as a Kelvin connection. This Kelvin connection allows current I to be injected into battery 10 through a first pair of terminals while the voltage V across the terminals 30 and 32 is measured by a second pair of connections. Because very little current flows through amplifier 52, the voltage drop across the inputs to amplifier 52 is substantially identical to the voltage drop across terminals 30 and 32 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. The microprocessor determines the change in battery voltage due to the current pulse I using amplifier 52 and analog-to-digital converter 54. The value of current I is generated by current source 50 is known and is stored in memory 60. In one embodiment, current I is obtained by applying a load to battery 12. Microprocessor 56 calculates the conductance of battery 12 using the following equation:

$$Conductance = G_{BAT} = \frac{\Delta I}{\Delta V} \qquad \text{Equation 1}$$

where $\Delta I$ is the change in current flowing through battery 12 due to current source 50 and $\Delta V$ is the change in battery voltage due to applied current $\Delta I$.

Based upon the battery conductance $G_{BAT}$ and the battery voltage, the battery tester 10 determines the condition of battery 12. A temperature sensor 74 can be thermally coupled to battery 12 and used to compensate battery measurements. Temperature readings can be stored in memory 60 for later retrieval.

As discussed below in greater detail, battery tester 16 is programmed with information which can be used with the determined battery conductance and voltage as taught in the above patents to Dr. Champlin and Midtronics, Inc. For example, if the battery conductance $G_{BAT}$ is lower than a predetermined threshold for a particular battery at a particular voltage, microprocessor 56 determines that battery 12 has failed the battery test. For example, as explained in the Champlin patents, the tester can compare the measured CCA (Cold Cranking Amp) with the rated CCA for that particular battery. Microprocessor 56 can also use information input from input device 66 provided by, for example, an operator. This information may consist of the particular type of battery, location, time, the name of the operator.

Input device 68 may comprise one or more sensors, for example, or other elements which provide information such as ambient or battery temperature, time, date, humidity, barometric pressure, noise amplitude or characteristics of noise in the battery or in the test result, or any other information or data which may be sensed or otherwise recovered which relates to the conditions of the test how the battery test was performed, or intermediate results obtained in conducting the test. Additional test condition information is provided by microprocessor 56. Such additional test condition information may include the values of $G_{BAT}$ and battery voltage, the various inputs provided to battery tester 10 by the operator which may include, for example, type of battery, estimated ambient or battery temperature, type of vehicle (i.e., such as provided through the Vehicle Identification Number (VIN) code for the vehicle) or the particular sequence of steps taken by the operator in conducting the test.

Figure 4:
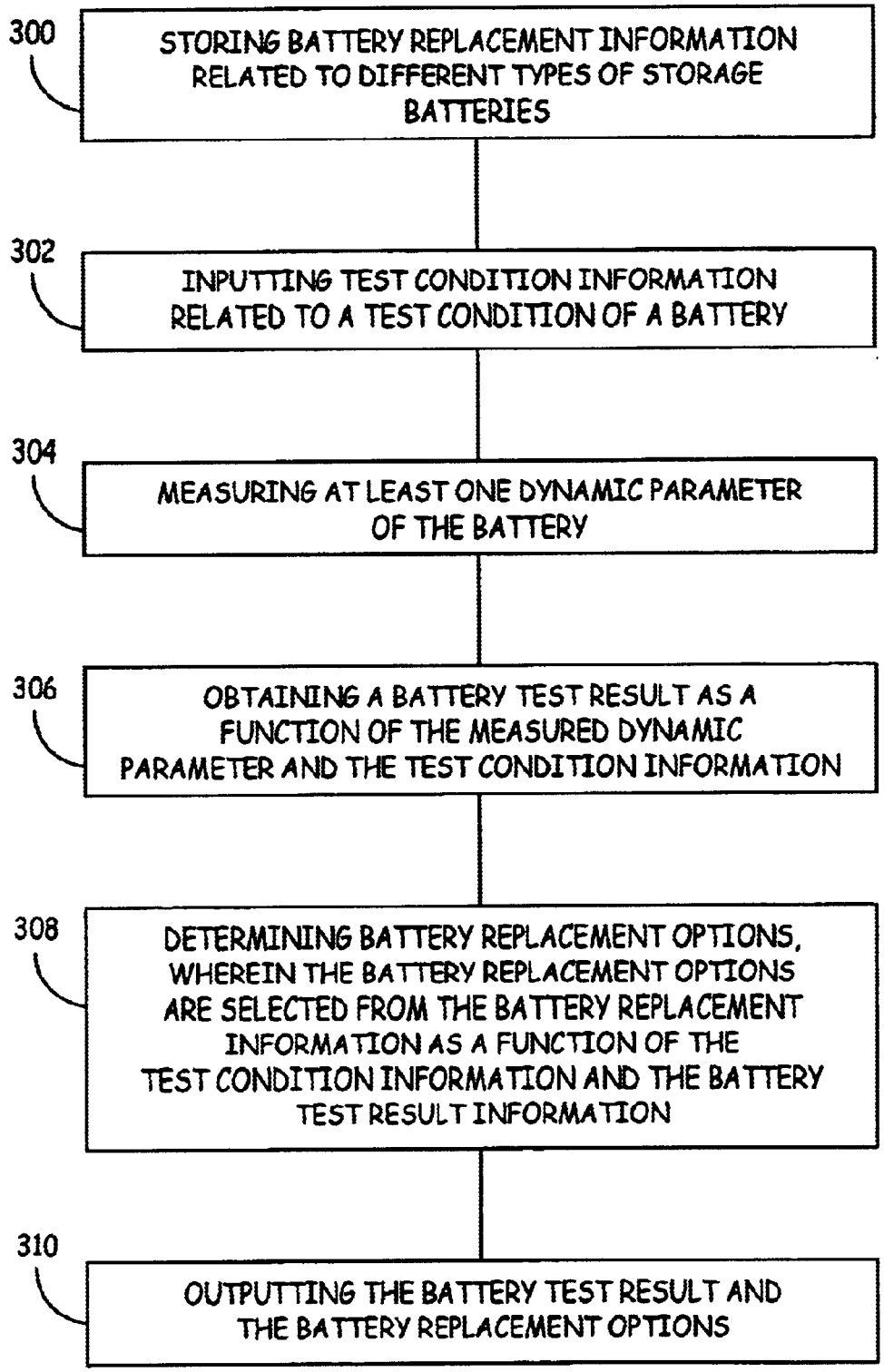
FIG. 4 is a flow chart representing a method of testing a storage battery in accordance with an illustrative embodiment of the present invention.

FIG. 4 is a flow chart representing a method of testing a storage battery in accordance with a specific illustrative embodiment of the present invention. At step 300, battery replacement information related to different types of batteries is stored. At step 302, test condition information related to a test condition of the battery is input. At step 304, at least one dynamic parameter of the battery is measured. At step 306, a battery test result is obtained as a function of the measured dynamic parameter and the test condition information. At step 308, battery replacement options are determined. These replacement options are selected from the battery replacement information as a function of the test condition information and the battery test result. At step 310, an output of the battery test result and the battery replacement output is provided.

In some embodiments, the battery replacement output 82 can be a specific battery. However, in some embodiments, the battery replacement output is a list of battery replacement options from which a technician or customer can select as desired. For example, if the replacement battery information includes information related to battery price or brand, the replacement options can include this information such that a customer can select a particular replacement battery based upon cost or brand preference.

Although the present invention has been described with reference to preferred embodiments, workers skilled in the art will recognize that changes may be made in form and detail without departing from the spirit and scope of the invention. The present invention is not limited to the particular battery testing techniques or flow charts illustrated herein. These have been provided as examples only. Battery tests can be modified as can the type of information in the battery environment information or in the battery replacement information. Any particular method or technique used to correlate the battery environment information and the battery replacement information with the battery replacement output can be chosen as desired. The battery replacement output can be provided locally as a visual, audio or other type of output, or can be transmitted to a remote location or stored or otherwise not immediately provided to a user or operator. The replacement output can, for example, be used to automatically have a battery delivered to the service area for a technician. Any type of input and output technique can be used to place information into or receive information from the battery tester including manual techniques or data communication techniques.

What is claimed is:

1. A method of testing a storage battery, comprising:
   obtaining a battery test result;
   obtaining battery environment information;
   obtaining battery replacement information; and
   providing a battery replacement output.

2. The method of claim 1 wherein providing the battery replacement output comprises outputting information related to a single replacement battery for the storage battery.

3. The method of claim 2 further comprising providing a price of the single replacement battery.

4. The method of claim 2 further comprising providing a quality level of the single replacement battery.

5. The method of claim 1 wherein providing the battery replacement output comprises outputting information related to different battery replacement options for the storage battery.

6. The method of claim 5 further comprising providing prices for the different battery replacement options.

7. The method of claim 5 further comprising providing quality levels for the different battery replacement options.

8. The method of claim 1 wherein providing the battery replacement output comprises providing information related to battery sales promotional activities.

9. The method of claim 1 wherein providing the battery replacement output comprises providing a visual output.

10. The method of claim 1 wherein providing the battery replacement output comprises providing an audio output.

11. The method of claim 1 wherein providing the battery replacement output comprises providing the battery replacement output at a remote location.

12. The method of claim 1 wherein obtaining battery environment information comprises obtaining information related to the geographical location in which the battery is used.

13. The method of claim 1 wherein obtaining battery environment information comprises obtaining information related to the seasons in which the battery is used.

14. The method of claim 1 wherein obtaining battery environment information comprises obtaining information related to a vehicle in which the battery is used.

15. The method of claim 1 wherein obtaining battery environment information comprises obtaining battery size information.

16. The method of claim 1 wherein obtaining the battery test result is carried out by measuring at least one dynamic parameter of the battery and obtaining the battery test result as a function of the measured dynamic parameter.

17. The method of claim 16 wherein the at least one dynamic parameter includes battery conductance.

18. A battery tester implementing the steps of claim 1.

19. The method of claim 1 wherein obtaining battery replacement information includes obtaining information related to battery type.

20. The method of claim 1 wherein obtaining battery replacement information includes obtaining information related to battery price.

21. The method of claim 1 wherein obtaining battery replacement information includes obtaining information related to battery warranty.

22. The method of claim 1 wherein the battery replacement output is provided as a function of the information related to battery warranty.

23. An apparatus for testing a storage battery, comprising:
   a processor configured to determine a battery replacement output based on a battery test result, battery environment information and battery replacement information; and
   an output device configured to report the battery replacement output.

24. The apparatus of claim 23 wherein the processor is part of a battery test circuit.

25. The apparatus of claim 24 wherein the battery test result is obtained by the battery test circuit.

26. The apparatus of claim 24 wherein the battery test circuit is configured to couple to terminals of the storage battery through a four point Kelvin connection.

27. The apparatus of claim 24 wherein the battery test circuit comprises a dynamic parameter measurement circuit.

28. The apparatus of claim 27 wherein the dynamic parameter measurement circuit is configured to measure at least one dynamic parameter of the battery, and wherein the battery test result is obtained as a function of the dynamic parameter.

29. The apparatus of claim 23 wherein the battery replacement output comprises information related to a single replacement battery for the storage battery.

30. The apparatus of claim 29 wherein the battery replacement output further comprises a price of the single replacement battery.

31. The apparatus of claim 29 wherein the battery replacement output further comprises a quality level of the single replacement battery.

32. The apparatus of claim 23 wherein the battery replacement output comprises information related to different battery replacement options for the storage battery.

33. The apparatus of claim 32 wherein the battery replacement output further comprises prices for the different battery replacement options.

34. The apparatus of claim 32 wherein the battery replacement output further comprises quality levels for the different battery replacement options.

35. The apparatus of claim 23 wherein the battery replacement output comprises information related to battery sales promotional activities.

36. The apparatus of claim 23 wherein the output device is configured to provide a visual output.

37. The apparatus of claim 23 wherein the output device is configured to provide an audio output.

38. The apparatus of claim 23 wherein the output device is situated at a remote location from the processor.

39. The apparatus of claim 23 wherein the battery environment information is related to the geographical location in which the battery is used.

40. The apparatus of claim 23 wherein the battery environment information is related to the seasons in which the battery is used.

41. The apparatus of claim 23 wherein the battery environment information is related to a vehicle in which the battery is used.

42. The apparatus of claim 23 wherein the battery environment information is related to battery size information.

43. The apparatus of claim 23 wherein the battery replacement information is related to battery type.

44. The apparatus of claim 23 wherein the battery replacement information is related to battery warranty.

45. The apparatus of claim 44 wherein the battery replacement output is determined as a function of the information related to battery warranty.

46. An electronic battery tester for testing a storage battery, comprising:
- a memory configured to store battery replacement information related to different types of storage batteries;
- an input adapted to receive battery environment information;
- test circuitry configured to measure at least one dynamic parameter of the battery and to obtain a battery test result as a function of the measured dynamic parameter and the test condition information, the test circuit further configured to determine battery replacement options, wherein the battery replacement options are selected from the battery replacement information as a function of the battery environment information and the battery test result; and
- output circuitry configured to output the battery test result and the battery replacement options.

47. The apparatus of claim 46 wherein the battery environment information includes information related to the battery.

48. The apparatus of claim 46 wherein the battery environment information includes information related to geographic location.

49. The apparatus of claim 46 wherein battery environment information includes information related to battery temperature.

50. The apparatus of claim 46 wherein the battery environment information includes information related to a vehicle which contains the battery.

51. The apparatus of claim 46 wherein the battery environment information includes battery type.

52. The apparatus of claim 46 wherein the at least one dynamic parameter includes battery conductance.

53. A method of testing a storage battery, comprising:
- storing battery replacement information related to different types of storage batteries;
- inputting battery environment information;
- measuring at least one dynamic parameter of the battery;
- obtaining a battery test result as a function of the measured dynamic parameter and the battery environment information;
- determining battery replacement options, wherein the battery replacement options are selected from the battery replacement information as a function of the battery environment information and the battery test result; and
- outputting the battery test result and the battery replacement options.

54. The method of claim 53 wherein the battery environment information includes information related to the battery.

55. The method of claim 53 wherein the battery environment information includes information related to geographic location.

56. The method of claim 53 wherein the battery environment information includes information related to battery temperature.

57. The method of claim 53 wherein the battery environment information includes information related to a vehicle which contains the battery.

58. The method of claim 53 wherein the battery environment information includes battery type.

59. The method of claim 53 wherein the at least one dynamic parameter includes battery conductance.

* * * * *